(12) United States Patent
Huang et al.

(10) Patent No.: US 12,518,979 B2
(45) Date of Patent: Jan. 6, 2026

(54) EXHAUST MANIFOLD FOR SEMICONDUCTOR PROCESS CHAMBER

(71) Applicant: Taiwan Semiconductor Manufacturing Company, Hsinchu (TW)

(72) Inventors: Sung-Ju Huang, Taipei (TW); Kuang-Wei Cheng, Hsinchu (TW); Yeh-Chieh Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 461 days.

(21) Appl. No.: 17/867,788

(22) Filed: Jul. 19, 2022

(65) Prior Publication Data
US 2024/0030045 A1 Jan. 25, 2024

(51) Int. Cl.
*H01L 21/67* (2006.01)
*H01L 21/324* (2006.01)

(52) U.S. Cl.
CPC ...... *H01L 21/67017* (2013.01); *H01L 21/324* (2013.01); *H01L 21/67109* (2013.01)

(58) Field of Classification Search
CPC ............ H01L 21/67017; H01L 21/324; H01L 21/67109; H01L 21/67103; H01L 21/6719
USPC ......................................................... 438/724
See application file for complete search history.

(56) References Cited

U.S. PATENT DOCUMENTS

| | | | | |
|---|---|---|---|---|
| 2003/0049372 A1* | 3/2003 | Cook | .................... | C23C 16/345 |
| | | | | 118/724 |
| 2007/0137794 A1* | 6/2007 | Qiu | ..................... | C23C 16/4584 |
| | | | | 118/725 |
| 2010/0117203 A1* | 5/2010 | Bailey | ................. | H01L 21/3144 |
| | | | | 438/770 |
| 2015/0329970 A1* | 11/2015 | Khan | .................. | H01L 21/6719 |
| | | | | 118/719 |

* cited by examiner

*Primary Examiner* — Duy Vu N Deo
(74) *Attorney, Agent, or Firm* — Lippes Mathias LLP (57) ABSTRACT

A method of curing or otherwise processing semiconductor wafers in an environmentally controlled process chamber includes: loading a plurality of semiconductor wafers into the process chamber such that pairs of adjacent semiconductor wafers are spaced apart from one another by gaps therebetween; introducing a process gas into the process chamber containing the plurality of semiconductor wafers; and drawing gas from the process chamber through one or more exhaust manifolds. Suitably, each exhaust manifold includes a plurality of inlet orifices through which gas is drawn into the exhaust manifold, at least one of the inlet orifices facing and aligning with each of the gaps.

20 Claims, 9 Drawing Sheets

EXHAUST MANIFOLD FOR SEMICONDUCTOR PROCESS CHAMBER

BACKGROUND

The following relates to the semiconductor arts, and in particular, to a method and apparatus for the manufacturing of semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features as shown in the accompany figures may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "left," "right," "side," "back," "rear," "behind," "front," "beneath," "below," "lower," "above," "upper," "over" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, semiconductor devices, for example, such as Metal-Oxide-Semiconductor Field-Effect Transistor (MOSFET) devices, electronic Integrated Circuits (ICs), Photonic Integrate Circuits (PICs), etc. are manufactured and/or fabricated from semiconductor wafers and/or on suitable substrates in a semiconductor fabrication plant, commonly referred to as a FAB or foundry. There are often many processing steps applied to the semiconductor wafer and/or substrate to produce a desired semiconductor device and/or numerous semiconductor devices on a semiconductor wafer or substrate. For example, semiconductor fabrication and/or manufacturing can be a multiple-step sequence of photolithographic, mechanical and/or chemical processing steps (for example, such as surface passivation, thermal oxidation, planar diffusion, junction isolation, etc.) during which electronic circuits and/or semiconductor devices are gradually created on the semiconductor wafer or substrate. Indeed, semiconductor fabrication and/or manufacturing may include but is not limited to Front End Of Line (FEOL), Middle End Of Line (MEOL) and Back End Of Line (BEOL) semiconductor manufacturing processes. For example, any one or more of various semiconductor fabrication and/or manufacturing process steps may be carried out to form and/or otherwise create any number of semiconductor devices on a semiconductor wafer or substrate, including, but not limited to: wafer cleaning and/or other substrate preparation steps; material deposition steps to build-up and/or create a variety of thin films and/or layers of material, for example, using Chemical Vapor Deposition (CVD), Plasma-Enhanced CVD (PECVD), Atomic Layer Deposition (ALD), Physical Layer Deposition (PLD), sputtering, epitaxial growth, Molecular-Beam Epitaxy (MBE), and/or other thin film or layer depositing and/or growing steps; material forming and/or patterning steps, like photolithography, including photoresist application, exposure, developing and etching (for example, such as dry or plasma etching and/or wet etching); other material removal and/or planarization steps such as Chemical Mechanical Polishing (CMP) or the like; n-type or p-type or other doping, ion implantation, annealing, oxidation and/or other material modification steps; via formation and/or metallization steps; wafer back-grinding and/or polishing; die preparation and/or wafer dicing steps; encapsulation steps; wafer and/or die testing or other metrology; etc. Accordingly, a FAB or foundry clean room or other like space where fabrication takes place typically contains many individual pieces of machinery or tools for semiconductor device production, for example, without limitation, such as steppers and/or scanners for photolithography, in addition to tools and/or equipment for material deposition, etching, cleaning, doping, curing, baking, testing, inspecting, staging, etc. During the fabrication or manufacturing process, a semiconductor wafer or substrate can be at times selectively transported or transferred from tool to tool and/or otherwise loaded into (or unloaded from) various tools with a robotic arm or the like, for example, such as an Equipment Front End Module (EFEM).

To provide reproducible processing, the process chamber is typically an environmentally controlled process chamber, where the environmental control typically includes controlling at least ambient gas composition, and sometimes also temperature. Furthermore, the ambient gas is usually flowed through the chamber continuously during the wafer processing to efficiently transport process gases (e.g., etchants, deposition precursors, or so forth) to the wafers and to provide for efficient removal of these process gases and any undesirable gaseous reactant products. Additionally, to provide high throughput as desirable in many FAB applications, the environmentally controlled process chamber is usually designed to simultaneously process a batch of semiconductor wafers that are loaded into the chamber and processed together. To maximize throughput it is desirable to maximize the number of wafers that are (or can be) loaded as a single batch. However, tightly packing a large number of wafers into the process chamber and processing them together can make it difficult to maintain tight control over the environmental parameters, such as the ambient gas flow over the surfaces of the wafers, since the space between wafers can become small as more wafers are packed into the chamber. Small gaps between wafers can produce "dead spots" where the gas flow is reduced, stagnant, or otherwise not uniform. Disclosed herein are improvements that facilitate uniform gas flow across wafer surfaces even when a large batch of wafers are loaded and processed together. In some nonlimiting illustrative examples, improved gas flow is achieved by providing an exhaust manifold that includes a plurality of inlet orifices through which gas is drawn into the exhaust manifold, with at least one of said inlet orifices facing and aligning with each of the gaps spacing apart two neighboring wafers of a batch of wafers loaded into the process chamber.

Figure 1:
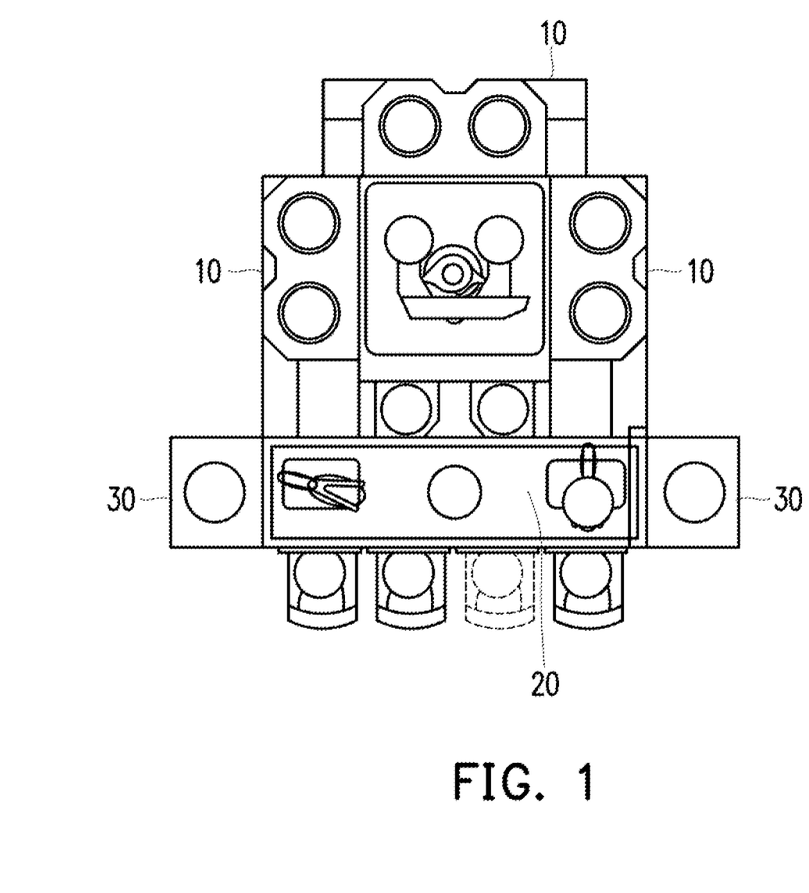
FIG. 1 diagrammatically illustrates a collection of semiconductor processing/manufacturing tools and/or equipment in accordance with some embodiments disclosed herein.

In accordance with some suitable embodiments, FIG. 1 shows a collection of semiconductor processing tools, chambers and/or equipment which may be employed in a semiconductor manufacturing facility, for example, such as a FAB or foundry or the like, to process and/or manufacture semiconductors, semiconductor devices, ICs and/or the like. In the illustrated embodiment, a plurality of material deposition stations 10 are suitably situated proximate to an Automated Material Handling System (AMHS) 20 which may include one or more staging areas used to temporarily or otherwise store and/or stage semiconductor wafers and/or substrates between processing steps, and one or more robotic arms or EFEMs that (i) selectively transport semiconductor wafers and/or substrates between tools, chambers, stations, staging areas and/or relevant equipment, and/or (ii) selectively load and/or unload semiconductor wafers and/or substrates from into and/or from tools, chambers, stations, staging area and/or relevant equipment.

In some suitable embodiments, the material deposition stations 10 may include one or more deposition chambers in which thin films and/or layers of semiconductor or other suitable materials are selectively deposited and/or otherwise formed on wafers or substrates, for example, using Flowable Chemical Vapor Deposition (FCVD) or another suitable deposition technique for creating a thin film or layer of material. Without limitation, suitable deposition techniques include, Chemical Vapor Deposition (CVD), Atomic-Layer Deposition (ALD), Physical Vapor Deposition (PVD), Plasma-Enhanced CVD (PECVD), Molecular-Beam Epitaxy (MBE), etc.

As shown in FIG. 1, a plurality of curing, baking or other like processing tools 30 are also suitably situated proximate to the robotic arms and/or EFEMs of the AMHS 20. In some suitable embodiments, the processing tools 30 may include one or more curing or process chambers (for example, such as the process chamber 100 shown in FIG. 2) in which semiconductor wafers are cured, baked or otherwise processed. In practice, one or more semiconductor wafers may be selectively loaded into and/or selectively unloaded from the process chambers by one or more of the robotic arms and/or EFEMs of the AMHS 20. In some suitable embodiments, a given process chamber 100 may include a plurality of stations (for example, such as the process chamber stations 110 shown in FIG. 2), each process chamber station 110 selectively accepting and/or holding a semiconductor wafer for curing and/or other like processing within the process chamber 100. In this way, the process chamber 100 simultaneously accommodates a plurality of semiconductor wafers being held at any given time within the process chamber 100 such that the plurality of wafers within the process chamber 100 may be cured, baked or otherwise processed simultaneously. This has the advantage of increasing the semiconductor manufacturing throughput, for example, as compared to curing, baking or otherwise processing a single semiconductor wafer at a time.

Figure 2:
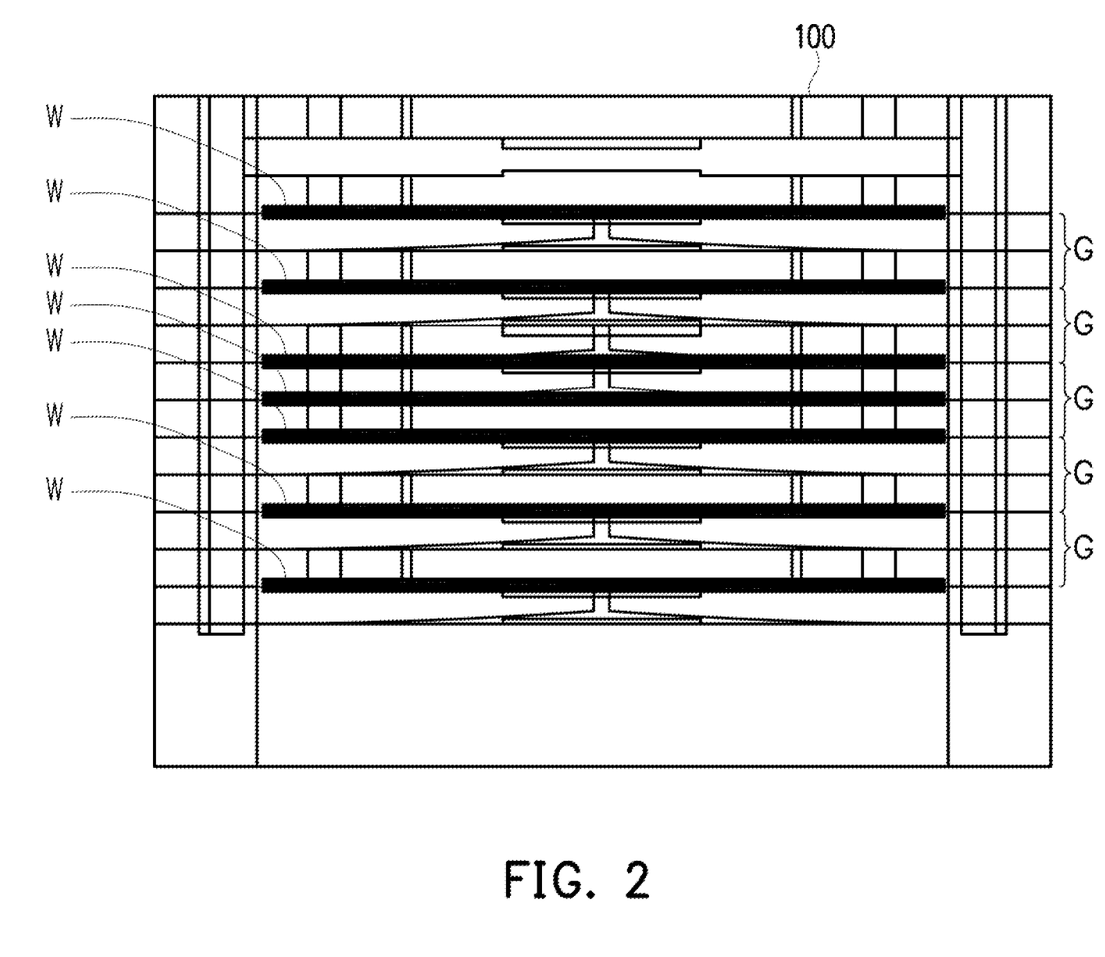
FIG. 2 diagrammatically illustrates a side cross-sectional view of a process chamber containing a plurality of semiconductor wafers in accordance with some embodiments disclosed herein.
Figure 4:
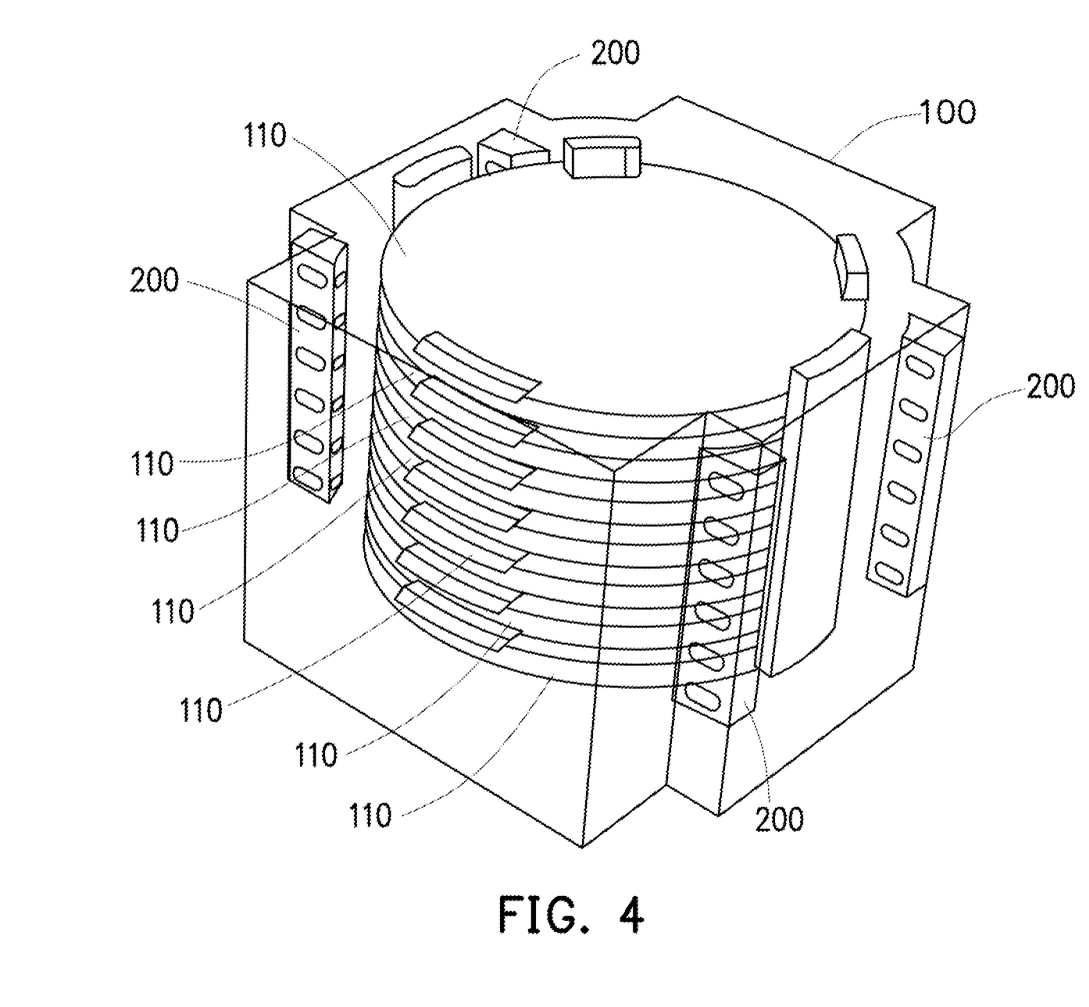
FIG. 4 diagrammatically illustrates a perspective view of the process chamber shown in FIG. 2, with selected surfaces and/or elements of the process chamber being transparent to illustrate interior components and/or elements.

With reference now to FIGS. 2 and 4, a process chamber 100 in accordance with some suitable embodiments disclosed herein is shown. For example, the process chamber 100 may be or correspond to one of the process chambers of one of the processing tools 30 shown in FIG. 1.

In practice, the process chamber 100 may include one or more walls, floors, ceilings or other surfaces defining an interior space within the process chamber 100 that is environmentally controlled, as well as being secure and/or separated from ambient conditions external to the process chamber 100. In practice, curing, baking and/or other like processes applied within the process chamber 100 are carried out at a controlled atmospheric pressure, temperature, with an introduced process gas, etc. and the interior space within the process chamber 100 may be controlled and/or regulated accordingly.

In the illustrated embodiment, the process chamber 100 includes a plurality of stations 110. In some suitable embodiments, each process chamber station 110 selectively accepts and/or holds a semiconductor wafer W or substrate within the process chamber 100. As shown, there are a number of process chamber stations 110 within the process chamber chamber 100. In practice, however, there may be more or less than the illustrated number of process chamber stations 110 within the process chamber 100.

In some suitable embodiments, each process chamber station 110 includes a mount, platform, stage, holder or the like in and/or on which a semiconductor wafer W or substrate is selectively placed and/or held, for example, during a curing or baking or other like process being applied within the process chamber 100. Optionally, the mount, platform, stage, holder or the like may include a chuck, for example, a vacuum or electrostatic chuck, which selectively holds the semiconductor wafer W or substrate in place within the process chamber station 110 during the curing or baking or other like process.

In some suitable embodiments, each process chamber station 110 within the process chamber 100 may include a showerhead. Suitably, each showerhead may include a perforated screen or plate or one or more inlet nozzles or the like through which a process or reaction gas is selectively flowed into the process chamber 100. In practice, the showerheads are employed to selectively introduce the process or reaction gas into the process chamber 100 over the semiconductor wafers W or substrates contained in the process chamber stations 110, for example, during the curing or baking or other process being applied within the process chamber 100. Accordingly, each showerhead is arranged to be positioned over and/or otherwise proximate to a location where the semiconductor wafer W or substrate is held within the respective process chamber station 110 to which the showerhead belongs.

In some suitable embodiments, each process chamber station 110 within the process chamber 100 may also include a heater. Suitably, the heaters are selectively controlled to regulate a temperature of the semiconductor wafers W or substrates within the respective process chamber stations 110. In practice, each heater may be operated to raise and/or hold a semiconductor wafer W or substrate located within the process chamber station 110 of the respective heater, to and/or at a desired operating temperature, for example, at which the curing or baking or other like process is carried out within the process chamber 100. In some embodiments, each heater may be arranged at a base of, below, around or otherwise proximate to a location where the semiconductor wafer W or substrate is held within the respective process chamber station 110 to which the heater belongs, for example, at a base of, below, around or otherwise proximate to the mount, platform, stage, holder or the like holding the semiconductor wafer W or substrate to be heated by the heater.

In some suitable embodiments, as shown in FIG. 2, the process chamber stations 110 may be vertically arranged one over the other, such that when a plurality of semiconductor wafers W or substrates are received and/or held therein, the semiconductor wafers or substrates are vertically stacked one over the other, with consecutive semiconductor wafers W or substrates being vertically spaced apart one from another, i.e., with a horizontally or laterally extending gap G interposed between each pair of otherwise adjacent semiconductor wafers W or substrates.

Figure 3:
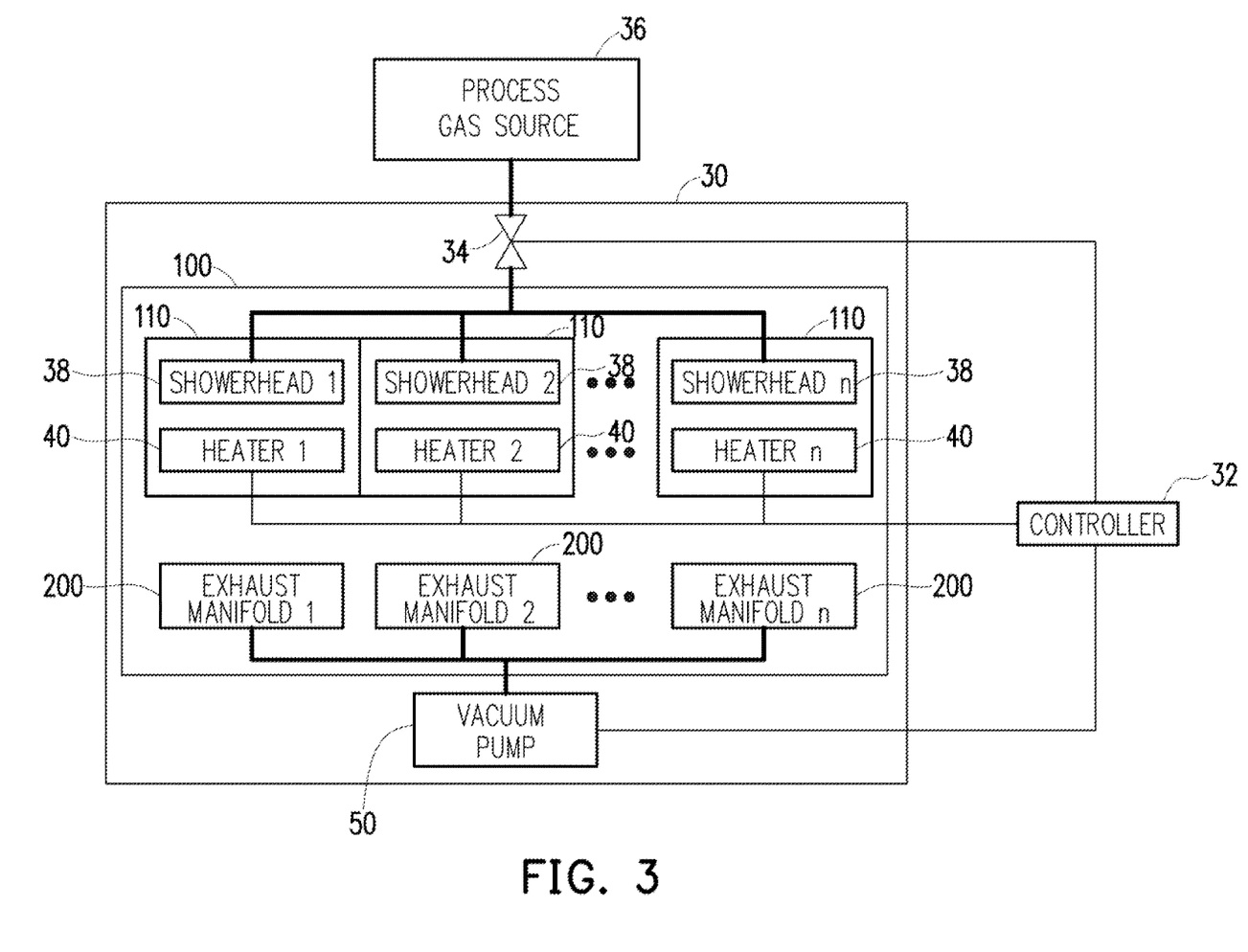
FIG. 3 diagrammatically illustrates a processing tool and corresponding controller in accordance with some embodiments disclosed herein.

With reference now to FIG. 3, the processing tool 30 may be operated by a controller 32. In some suitable embodiments, the controller 32 selectively opens and/or closes one or more valves 34 to control and/or regulate a flow of one or more selected process or reaction gases from a gas source 36 to one or more of the showerheads 38 included in the process chamber stations 110. For example, the process gas or reaction gas may be one or more of oxygen (02) or ozone (03) or other suitable process/reaction gases or combinations thereof.

In some suitable embodiments, the controller 32 may also selectively control or regulate operation of the heaters 40 included in the process chamber stations 110 in order to bring or hold the semiconductor wafers or substrates held within the process chamber stations 110 to or at a desired operating temperature. Additionally, the controller 32 may also selectively control and/or regulate operation of a vacuum pump 50 to selectively draw gas from and/or create a desired gas flow through the process chamber 100 via one or more exhaust manifolds 200 that are situated and/or arranged within the process chamber 100. That is to say, in practice, the exhaust manifolds 200 are operatively connected to and/or in fluid communication with the vacuum pump 50 such that when the vacuum pump 50 is operated gas is withdrawn from the process chamber 100 through the exhaust manifolds 200 connected to the vacuum pump 50.

In some embodiments, the controller 32 may be implemented via hardware, software, firmware or a combination thereof. In particular, one or more controllers may be embodied by processors, electrical circuits, computers and/or other electronic data processing devices that are configured and/or otherwise provisioned to perform one or more of the tasks, steps, processes, methods and/or functions described herein. For example, a processor, computer, server or other electronic data processing device embodying a controller may be provided, supplied and/or programmed with a suitable listing of code (e.g., such as source code, interpretive code, object code, directly executable code, and so forth) or other like instructions or software or firmware, such that when run and/or executed by the computer or other electronic data processing device one or more of the tasks, steps, processes, methods and/or functions described herein are completed or otherwise performed. Suitably, the listing of code or other like instructions or software or firmware is implemented as and/or recorded, stored, contained or included in and/or on a non-transitory computer and/or machine readable storage medium or media so as to be providable to and/or executable by the computer or other electronic data processing device. For example, suitable storage mediums and/or media can include but are not limited to: floppy disks, flexible disks, hard disks, magnetic tape, or any other magnetic storage medium or media, CD-ROM, DVD, optical disks, or any other optical medium or media, a RAM, a ROM, a PROM, an EPROM, a FLASH-EPROM, or other memory or chip or cartridge, or any other tangible medium or media from which a computer or machine or electronic data processing device can read and use. In essence, as used herein, non-transitory computer-readable and/or machine-readable mediums and/or media comprise all computer-readable and/or machine-readable mediums and/or media except for a transitory, propagating signal. More generally, any one or more of the particular tasks, steps, processes, methods, functions, elements and/or components described herein may be implemented on and/or embodiment in one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. In some suitable embodiments, any device, capable of implementing a finite state machine that is in turn capable of implementing the respective tasks, steps, processes, methods and/or functions described herein can be used.

In some suitable embodiments, the controller 32 may be programmed or otherwise provisioned to regulate and/or control and/or otherwise coordinate operation of the various elements and/or components (for example, such as the valve 34, heaters 40 and/or vacuum pump 50) of the process chamber 100 and/or the processing tool 30 in concert to execute a desired curing or other semiconductor processing protocol. In some suitable embodiments, the controller 32 may include one or more input or output devices (not shown). In practice, one or more output device may display, provide or otherwise output user perceivable indications of the process conditions within the process chamber 100, for example, the pressure, the temperature, the operational state of the various elements and/or components, etc. In practice, one or more input devices may be employed by a user or operator of the processing tool 30 and/or process chamber 100 to manually enter control commands, signal, messages and/or the like which in turn cause the controller 32 to control, regulate and/or otherwise operate the various elements and/or components of the process chamber 100 and/or processing tool 30 accordingly. In some embodiments, manual operation may be undertaken by the user on an ad hoc basis, or the user inputs may be employed to program the controller to automatically run a selected or set semiconductor processing protocol.

With reference now to FIG. 4, in some suitable embodiments, one or more exhaust manifolds 200 are situated within the process chamber 100. Suitably, as shown, four exhaust manifolds 200 are arranged in four corners within the process chamber 100 at locations around and/or proximate to an outer periphery of the process chamber stations 110, for example, such that the exhaust manifolds 200 are roughly equally spaced about a circumference and/or the outer periphery of the process chamber stations 110. In some suitable embodiments, each exhaust manifold 200 is positioned adjacent and/or attached to a wall and/or interior surface of the process chamber 100. In practice, more or less than four exhaust manifolds 200 may be employed, for example, depending on the size, shape and/or configuration of the process chamber 100 and/or process chamber stations 110.

Figure 5A:
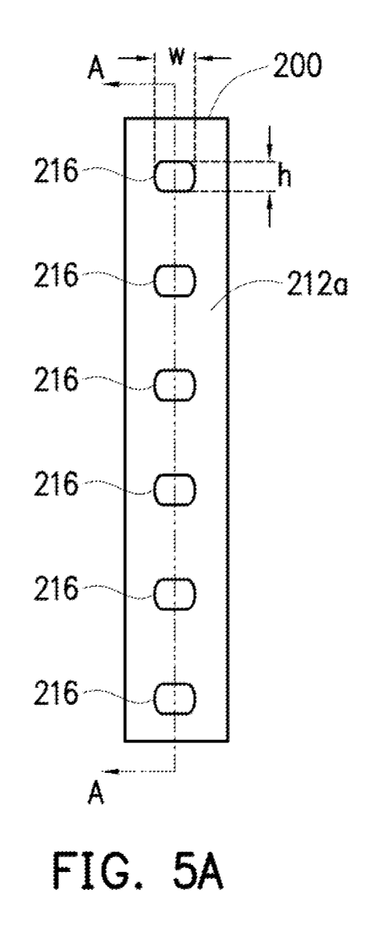
FIG. 5A diagrammatically illustrates a front view of an exhaust manifold in accordance with some embodiments disclosed herein.
Figure 5B:
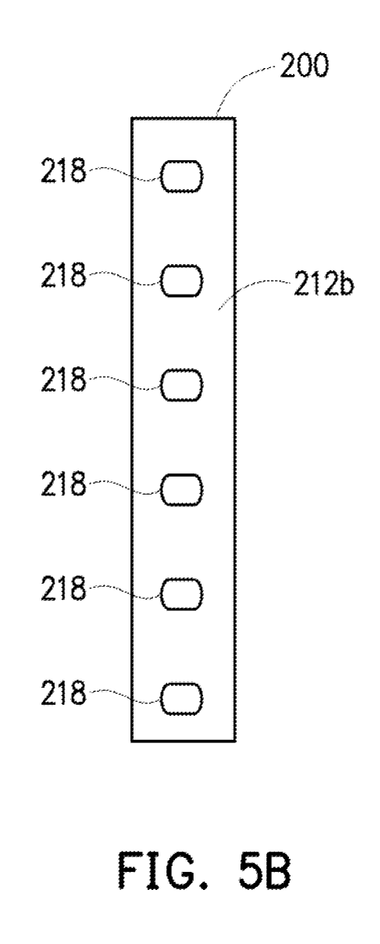
FIG. 5B diagrammatically illustrates a back view of the exhaust manifold shown in FIG. 5A.
Figure 5C:
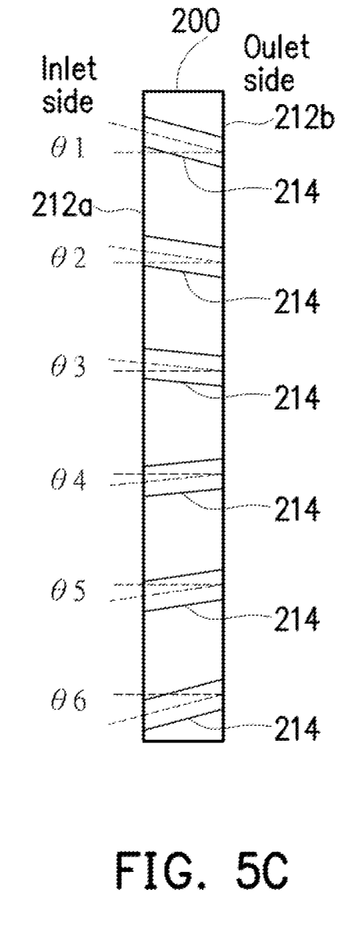
FIG. 5C diagrammatically illustrates a side cross-section view of the exhaust manifold shown in FIG. 5A, taken along section line A-A.

FIGS. 5A, 5B and 5C show an exhaust manifold 200 in accordance with some suitable embodiments described herein. As shown, the exhaust manifold 200 is a substantially vertically extending member that is defined by one or more outer surfaces or sides, with one or more bore holes or passages 214 extending roughly horizontally or laterally therethrough from a first side of the exhaust manifold 200 to a second side of the exhaust manifold 200, for example, from a first outer surface or side 212a of the exhaust manifold 200 to a second outer surface or side 212b of the exhaust manifold 200. At the first side or surface 212a, each bore hole or passage 214 forms a hole or inlet orifice 216 of the exhaust manifold 200, and at the second side or surface 212b, each bore hole or passage 214 forms a hole or outlet orifice 218 of the exhaust manifold 200. In some suitable embodiments, each exhaust manifold 200 is arranged within the process chamber 100 such that the inlet orifices 216 on the first surface or side 212a of the exhaust manifold 200 face the process chamber stations 110, while the opposing outlet orifices 218 on the second surface or side 212b of the exhaust manifold 200 face an interior wall or surface of the process chamber 100.

Suitably, each exhaust manifold 200 has a plurality of bore holes and/or passages 214 formed therein at different elevations along a vertical length of the exhaust manifold 200. In some suitable embodiments, each exhaust manifold 200 is arranged within the process chamber 100 such that the inlet orifices 216 of the exhaust manifold 200 at different elevations along the vertical length of the exhaust manifold 200 are aligned with the gaps G interposed between adjacent pairs of semiconductor wafers W or substrates when such semiconductor wafers W or substrates are positioned and/or held in the process chamber stations 110.

In practice, the outlet orifices 218 of each exhaust manifold 200 are operatively connected to and/or in fluid communication with the vacuum pump 50, for example, such that gas is drawn from the process chamber 100 through the exhaust manifolds 200 by the vacuum pump 50. More specifically, gas is withdrawn from the process chamber 100 into each exhaust manifold 200 through the inlet orifices 216 of the exhaust manifold 200. In turn, the gas drawn into the exhaust manifold 200 is directed along the respective bore holes and/or passages 214 formed in the exhaust manifold 200 toward the outlet orifices 218 where it exits the exhaust manifold 200 and the process chamber 100. In practice, the outlet orifices 218 of each exhaust manifold 200 face the wall and/or interior surface of the process chamber 100 to which the exhaust manifold 200 is attached and align with corresponding exit holes and/or orifices formed therein such that gas withdrawn from the process chamber 100 through the exhaust manifold 200 may exit the process chamber 100 through the exit holes. In practice, particles and/or other contaminates within the process chamber 100, for example, suspended within the gas drawn into the exhaust manifolds 200 are likewise drawn into the exhaust manifolds 200 by the gas flow and expelled therewith from the process chamber 100. Accordingly, such contaminants and/or other like particles are inhibited from landing and/or remaining on the semiconductor wafers W or substrates placed and/or held in the process chamber stations 110 for curing and/or other like processing, thereby guarding against defects arising on the semiconductor wafers W or substrates.

Figure 6:
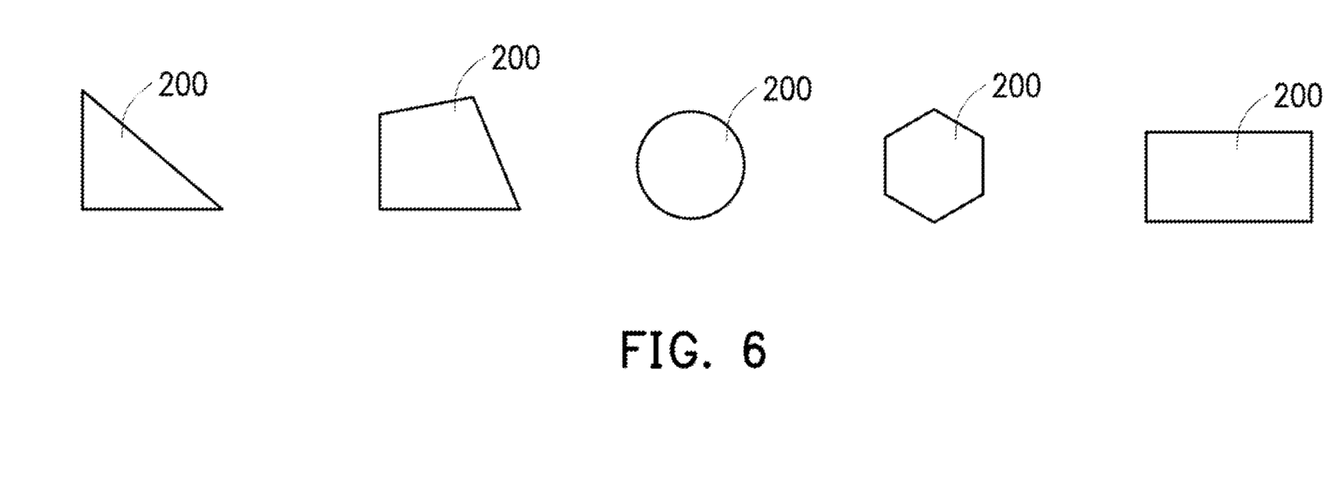
FIG. 6 diagrammatically illustrates a variety of top views of different shaped exhaust manifolds in accordance with some embodiments disclosed herein.

In some suitable embodiments, a horizonal cross-section of each exhaust manifold 200 may take a variety of shapes defined by the one or more vertically extending outer surfaces or side walls of the exhaust manifold 200. For example, the shape may be rectangular, square, triangular, polygonal, quadrilateral, hexagonal, circular, oval shaped or another curved shape or otherwise. FIG. 6 shows a number of top views of various different embodiments having such different shapes. For simplicity and/or clarity herein, the various FIGURES illustrate the inlet orifices 216 and outlet orifices 218 and/or passages 214 therebetween having cross-sections or areas or the like of certain shapes. For example, the inlet orifices 216 and/or outlet orifices 218 are shown having generally oblong shapes or as rectangles with rounded corners. However, it is to be appreciated that in practice the shapes of the inlet orifices 216, outlet orifices 218 and/or passages 214 therebetween may be rectangular, square, triangular, polygonal, quadrilateral, hexagonal, circular, oval shaped or another curved shape or otherwise, for example.

Figure 7A:
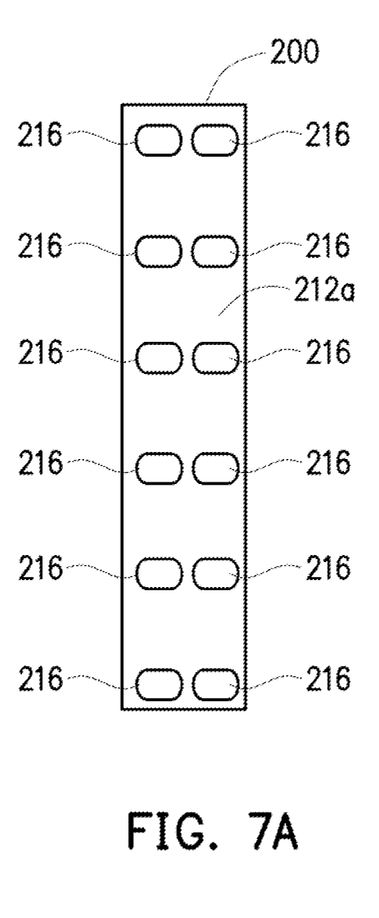
FIG. 7A diagrammatically illustrates a front view of an exhaust manifold in accordance with some embodiments disclosed herein.
Figure 7B:
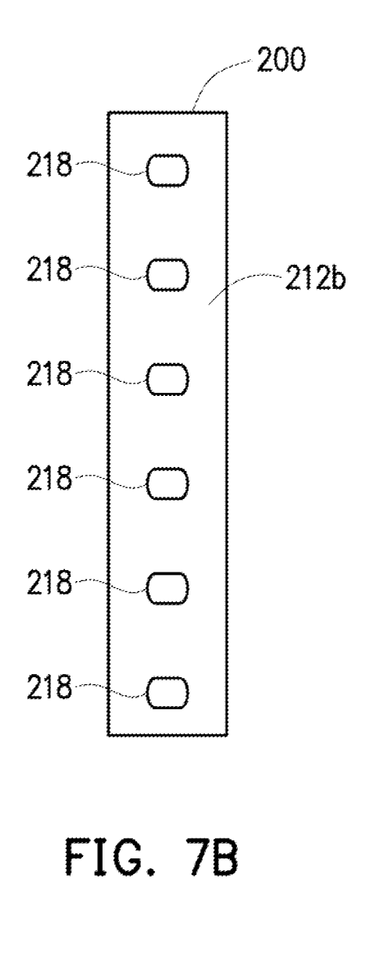
FIG. 7B diagrammatically illustrates a back view of the exhaust manifold shown in FIG. 7A.

In some suitable embodiments, each bore hole or passage connects and/or extends from a plurality of inlet orifices 216 at a given elevation along a vertical length of the exhaust manifold 200 to a common outlet orifice 218. For example, as shown in FIGS. 7A and 7B, at each elevation along a vertical length of the exhaust manifold 200, there is provided two inlet orifices 216 on a first side or surface 212a of the exhaust manifold 200 which are connected with a common outlet orifice 218 on a second opposing side or surface 212b of the exhaust manifold 200 via suitable bore holes and/or passages extending therebetween, for example, which bore holes and/or passages may branch and/or converge accordingly through the exhaust manifold 200. In some suitable embodiments, for example as shown in FIG. 8, at each elevation along a vertical length of the exhaust manifold 200, the plurality of inlet orifices 216 connecting with a common outlet orifice 218 may be arranged on different surfaces or side walls 212a and 212c of the exhausted manifold 200, for example with corresponding bore holes and/or passages branching and/or converging accordingly through the exhaust manifold 200.

Figure 8:
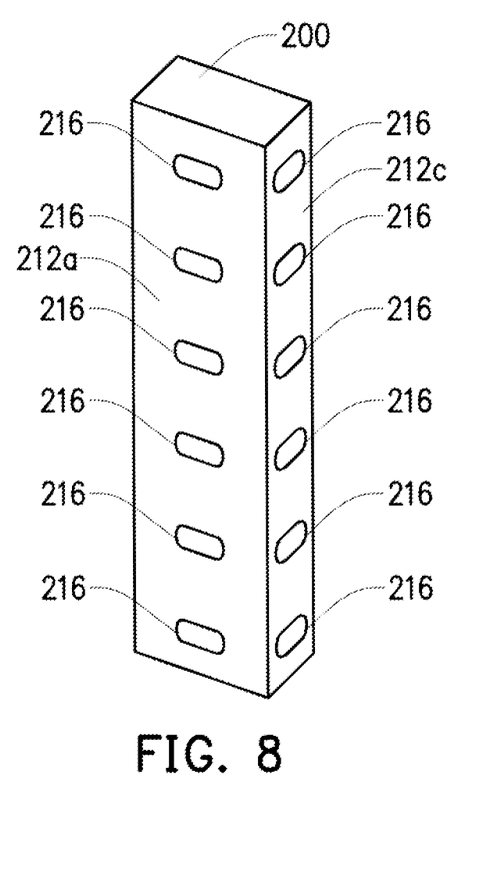
FIG. 8 diagrammatically illustrates a perspective view of an exhaust manifold in accordance with some embodiments disclosed herein.

In some suitable embodiments, for example as shown in FIG. 8, the dimensions and/or size of the inlet orifices 216 of the exhaust manifold 200 may vary along the vertical length of the exhaust manifold 200. For example, in some suitable embodiments, the size or dimensions of the inlet orifices 216 may progressively decrease in size and/or dimensions from an upper end of the exhaust manifold 200 to a lower end of the exhaust manifold 200.

More generally, in practice, a lateral dimension or width w of the inlet orifices 216 of the exhaust manifold 200 (for example, as shown in FIG. 5A) may be in a range of between about 20 millimeters (mm) and about 26 mm, inclusive; and a vertical dimension or height h of the inlet orifices 216 of the exhaust manifold 200 (for example, as shown in FIG. 5A) may be in a range of between about 10 mm and about 13 mm, inclusive.

Returning attention now to FIGS. 5A, 5B and 5C, in some suitable embodiments, an elevation of each inlet orifice 216 of the exhaust manifold 200 may be different than an elevation of the corresponding outlet orifice of the exhaust manifold 200 to which the inlet orifice 216 is connected via the corresponding bore hole or passage 214. That is to say, for example, the bore holes or passages 214 extending through the exhaust manifold 200 may do so at an angle which is not normal with respect to the first and second sides or surfaces 212a and 212b of the exhaust manifold. In some suitable embodiments, the angles that the bore holes and/or passages 214 make as they extend through the exhaust manifold 200 may be different and/or progressively vary at different elevation along a vertical length of the exhaust manifold 200, for example, from the upper end of the exhaust manifold 200 to the lower end of the exhaust manifold 200. As shown in FIG. 5C, for example, a direction of the bore holes and/or passages 214 may form angles $\theta 1$ through $\theta 6$ with respect to a horizonal plane that is normal to the sides or surfaces 212a and 212b of the exhaust manifold 200. In practice, the angles $\theta 1$ and $\theta 6$ may be greater than or equal to angles $\theta 2$ and $\theta 5$. In practice, the angles $\theta 2$ and $\theta 5$ may be greater than or equal to the angles $\theta 3$ and $\theta 4$.

Figure 9:
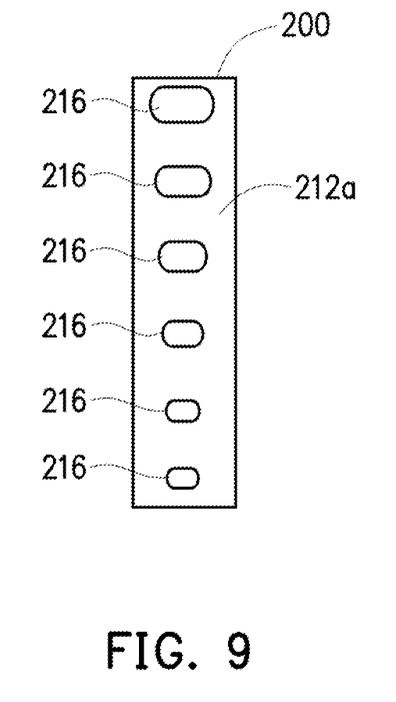
FIG. 9 diagrammatically illustrates a front view of an exhaust manifold in accordance with some embodiments disclosed herein.

In some suitable embodiments, various aspects and/or features of the exhaust manifold 200 of different embodiments described herein may combined in any given exhaust manifold 200. For example, in some suitable embodiments, the feature of having multiple inlet orifices 216 connecting to a common outlet orifice 218 (for example, as shown in the embodiments of FIGS. 7A, 7B and 8) may be combined with the feature of having angled bore holes and/or passages extending through the exhaust manifold 200 (for example, as shown in the embodiment of FIGS. 5A through 5C). Likewise, in some suitable embodiments, the feature of having different or progressively varying inlet orifice sizes (for example, as shown in the embodiment of FIG. 9) may be combined with the either or both of the aforementioned features.

In some suitable embodiments, the exhaust manifolds 200 described herein have numerous advantages. For example, one advantage is that the exhaust manifold 200 can have a relatively simplified configuration and/or construction as compared to other exhaust manifolds. This simplified configuration and/or construction can result in a lower production cost for the exhaust manifold 200. For example, the simplified configuration and/or construction of the exhaust manifolds 200 can result in the exhaust manifolds 200 collectively having fewer than 100 total orifices through which gas is pumped and/or expelled from the process chamber 100 as compared to other exhaust manifold configurations which can collectively includes more than 200 total orifices. The reduced number of orifices and/or bore holes or passages has the further advantage that cleaning and/or servicing of the exhaust manifolds 200 (which potential may become clogged or restricted from time to time by particles or other contaminates getting stuck therein) is easier and/or less time consuming insomuch as there are fewer orifices and/or bore holes or passage to clean. Accordingly, down time of the processing tool is reduced. This reduced downtime can in turn improve the overall semiconductor manufacturing throughput.

In some embodiments, another advantage of the exhaust manifolds 200 described herein is improved exhaust pumping efficiency and/or gas flow through the process chamber 100. In turn, the improved pumping efficiency and/or gas flow rate and/or uniformity through the process chamber 100 can result in fewer particles and/or contaminants landing and/or remaining on the semiconductor wafers W or substrates being processed within the process chamber 100 and hence fewer potential defects in the semiconductor or semiconductor devices being manufactures, i.e., a higher defect free yield.

In the following, some further illustrative embodiments are described.

In some embodiments, a method of curing semiconductor wafers in an environmentally controlled process chamber includes: loading a plurality of semiconductor wafers into the process chamber such that pairs of adjacent semiconductor wafers are spaced apart from one another by gaps therebetween; introducing a process gas into the process chamber containing the plurality of semiconductor wafers; and drawing gas from the process chamber through one or more exhaust manifolds. Suitably, each exhaust manifold includes a plurality of inlet orifices through which gas is drawn into the exhaust manifold, at least one of the inlet orifices facing and aligning with each of the gaps.

In some further embodiments, each exhaust manifold further includes a plurality of outlet orifices through which gas drawn into the exhaust manifold is expelled from the exhaust manifold, the plurality of outlet orifices being connected to the plurality of inlet orifices via a plurality of passages extending through the exhaust manifold.

In still additional embodiments, the inlet orifices are formed on a first vertically extending side of the exhaust manifold, the outlet orifices are formed on a second vertically extending side of the exhaust manifold different from the first side, and each of the passages extend from the first side to the second side at an angle with respect thereto, the angle being other than normal to the first and second sides.

In some embodiments, at least one angle of at least one passage is different from at least one other angle of at least one other passage.

In yet further embodiments, sizes of the inlet orifices vary along a vertical length of each exhaust manifold.

In some further embodiments, the sizes of the inlet orifices progressively decrease from a first end of each exhaust manifold to a second end of each exhaust manifold.

In some embodiments, more than one of the plurality of inlet orifices align with each of the gaps.

In yet further embodiments, each exhaust manifold includes a plurality of outlet orifices through which gas drawn into the exhaust manifold is expelled from the exhaust manifold, each of the plurality of outlet orifices being connected to more than one of the plurality of inlet orifices via a plurality of passages extending through the exhaust manifold.

In some embodiments, an exhaust manifold, of an environmentally controlled semiconductor curing chamber in which a plurality of semiconductor wafers are selectively loaded with gaps interposed between adjacent pairs of the plurality of semiconductor wafers, includes: a first vertically extending side wall; a plurality of inlet orifices formed in the first side wall; a second vertically extending side wall; a plurality of outlet orifices formed in the second side wall; and a plurality of passages extending laterally through the exhaust manifold between the inlet orifices and the outlet orifices. Suitably, at least one of the inlet orifices faces and aligns with each of said gaps and gas is selectively drawn into the exhaust manifold through the inlet orifices and expelled out of the exhaust manifold through the outlet orifices.

In some further embodiments, each of the passages extend from the first side wall to the second side wall at an angle with respect thereto, the angle being other than normal to the first and second side walls.

In still further embodiments, at least one angle of at least one passage is different from at least one other angle of at least one other passage.

In yet additional embodiments, sizes of the inlet orifices vary along a vertical length of the exhaust manifold.

In some further embodiments, the sizes of the inlet orifices progressively decrease from a first end of the exhaust manifold to a second end of the exhaust manifold.

In some additional embodiments, more than one of the plurality of inlet orifices align with each of the gaps.

In some embodiments, each of the plurality of outlet orifices is connected to more than one of the plurality of inlet orifices via the plurality of passages extending through the exhaust manifold.

In some embodiments, a semiconductor curing chamber includes: a plurality of stations in which a plurality of semiconductor wafers are selectively positioned, each station having a showerhead that selectively introduces a reaction gas over the semiconductor wafer positioned within the station and a heater that selectively heats the semiconductor wafer position within the station, the stations being arranged within the curing chamber such that when positioned therein the plurality of semiconductor wafers are vertically stacked one over another and adjacent pairs of the plurality of semiconductor wafers are separate from one another by gaps interposed therebetween; and a plurality of vertically extending exhaust manifolds arranged with the curing chamber at given locations about an outer periphery of the stations. Each of the exhaust manifolds includes: a plurality of inlet orifices formed on a first side of the exhaust manifold; a plurality of outlet orifices formed on a second side of the exhaust manifold; and a plurality of passages extending laterally through the exhaust manifold between the inlet orifices and the outlet orifices. Suitably, at least one of the inlet orifices faces and aligns with each of said gaps and gas is selectively drawn into the exhaust manifold through the inlet orifices and expelled out of the exhaust manifold through the outlet orifices.

In some further embodiments, each of the passages extend from the first side to the second side at an angle with respect thereto, the angle being other than normal to the first and second sides.

In still further embodiments, at least one angle of at least one passage is different from at least one other angle of at least one other passage.

In yet further embodiments, sizes of the inlet orifices vary along a vertical length of at least one of the exhaust manifolds.

In still one more embodiment, the sizes of the inlet orifices progressively decrease from a first end of the exhaust manifold to a second end of the exhaust manifold.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of curing semiconductor wafers in an environmentally controlled process chamber, said method comprising:

loading a plurality of semiconductor wafers into the process chamber such that each of the plurality semiconductor wafers are vertically stacked, each of the plurality of semiconductor wafers are vertically spaced apart from one another by gaps laterally extending therebetween, each of the plurality semiconductor wafers are positioned proximate to one of a plurality of showerheads mounted over each of the plurality of semiconductor wafers and gaps therebetween, and each of the plurality of showerheads have a plurality of nozzles aligned to direct a process gas flow into the gap and towards a face of one of the plurality of semiconductor wafers loaded in the process chamber;

introducing the process gas into the process chamber by directing the process gas to each of the plurality of showerheads to expose a face of each of the plurality of semiconductor wafers to the process gas; and drawing the introduced process gas from the process chamber through a plurality of exhaust manifolds spaced apart and proximately located at a periphery of the plurality of semiconductor wafers in the process chamber;

wherein each exhaust manifold includes a plurality of inlet orifices formed at different elevations along a vertical length of the exhaust manifold through which the process gas is drawn from each of the gaps between the plurality of semiconductor wafers into the exhaust manifold and expelled from the exhaust manifold, and each of the plurality of inlet orifices has a bore with an opening facing and horizontally aligned with a respective gap and a respective semiconductor wafer face adjacent to the respective gap to direct the flow of the process gas along the respective semiconductor wafer face from a respective showerhead mounted over the respective semiconductor wafer face.

2. The method of claim 1, wherein each exhaust manifold further comprises:

a plurality of outlet orifices through which the process gas drawn into the exhaust manifold is expelled from the exhaust manifold, said plurality of outlet orifices being connected to the plurality of inlet orifices via a plurality of passages extending through the exhaust manifold.

3. The method of claim 1, wherein said inlet orifices are formed on a first vertically extending side of the exhaust manifold, said outlet orifices are formed on a second vertically extending side of the exhaust manifold different from the first side, and each of said passages extend from the first side to the second side at an angle with respect thereto, said angle being other than normal to the first and second sides.

4. The method of claim 3, wherein at least one angle of at least one passage is different from at least one other angle of at least one other passage.

5. The method of claim 1, wherein sizes of the inlet orifices vary along the vertical length of each exhaust manifold.

6. The method of claim 5, wherein the sizes of the inlet orifices progressively decrease from a first end of each exhaust manifold to a second end of each exhaust manifold.

7. The method of claim 1, wherein the plurality of inlet orifices are horizontally aligned with a plurality of outlet orifices.

8. The method of claim 1, wherein each exhaust manifold comprises:
a plurality of outlet orifices through which gas drawn into the exhaust manifold is expelled from the exhaust manifold, each of said plurality of outlet orifices being connected to more than one of the plurality of the inlet orifices via a plurality of passages extending through the exhaust manifold.

9. A method of curing semiconductor wafers in an environmentally controlled process chamber, said method comprising:
loading a plurality of semiconductor wafers into the process chamber such that each of the plurality semiconductor wafers are vertically stacked, each of the plurality of semiconductor wafers are vertically spaced apart from one another by gaps laterally extending therebetween, each of the plurality semiconductor wafers are positioned proximate to one of a plurality of showerheads mounted over each of the plurality of semiconductor wafers and gaps therebetween, and each of the plurality of showerheads have a plurality of nozzles aligned to direct a gas flow into the gap and towards a face of one of the plurality of semiconductor wafers loaded in the process chamber;
introducing the process gas into the process chamber by directing the process gas to each of the plurality of showerheads to expose a face of each of the plurality of semiconductor wafers to the process gas; and
drawing the introduced process gas from the process chamber through an exhaust manifold from the exhaust manifold, spaced apart and proximately located at a periphery of the plurality of semiconductor wafers in the process chamber;
wherein the exhaust manifold includes a first vertically extending side wall, a plurality of inlet orifices formed at different elevations along a vertical length of the first side wall, a second vertically extending side wall, a plurality of outlet orifices formed in the second side wall, a plurality of passages extending laterally through the exhaust manifold between the inlet orifices and the outlet orifices, each of the plurality of inlet orifices has a bore with an opening facing and horizontally aligned with a respective gap and a respective semiconductor wafer face adjacent to the respective gap to direct the flow of the process gas along the respective semiconductor wafer face from a respective showerhead mounted over the respective semiconductor wafer face and the process gas is selectively drawn into the exhaust manifold through the plurality of inlet orifices and expelled out of the exhaust manifold through the plurality of outlet orifices.

10. The method of claim 9, wherein each of said passages extend from the first side wall to the second side wall at an angle with respect thereto, said angle being other than normal to the first and second side walls.

11. The method of claim 10, wherein at least one angle of at least one passage is different from at least one other angle of at least one other passage.

12. The method of claim 9, wherein sizes of the inlet orifices vary along the vertical length of the exhaust manifold.

13. The method of claim 12, wherein the sizes of the inlet orifices progressively decrease from a first end of the exhaust manifold to a second end of the exhaust manifold.

14. The method of claim 9, wherein plurality of inlet orifices are horizontally aligned with a plurality of outlet orifices.

15. The method of claim 14, wherein each of said plurality of outlet orifices is connected to more than one of the plurality of inlet orifices via the plurality of passages extending through the exhaust manifold.

16. A method of curing semiconductor wafers in a semiconductor curing chamber, said method comprising:
loading a plurality of semiconductor wafers into the semiconductor curing chamber such that each of the plurality semiconductor wafers are vertically stacked, each of the plurality of semiconductor wafers are vertically spaced apart from one another by gaps laterally extending therebetween, each of the plurality semiconductor wafers are positioned proximate to one of a plurality of stations mounted over each of the plurality of semiconductor wafers and gaps therebetween, and each of the plurality of stations include a heater and a showerhead having a plurality of nozzles aligned to direct a reaction gas flow into the gap and towards a face of one of the plurality of semiconductor wafers loaded in the semiconductor processing chamber;
controlling the plurality of station showerheads to selectively introduce the reaction gas over each of the plurality of semiconductor wafers positioned within the plurality of stations; and
controlling the heater to selectively heat each of the plurality of semiconductor wafers positioned within the plurality of stations,
wherein the semiconductor curing chamber includes an exhaust manifold spaced apart and proximately located at a periphery of the plurality of semiconductor wafers in the semiconductor curing chamber, the exhaust manifold including a first vertically extending side wall, a plurality of inlet orifices formed at different elevations along a vertical length of the first side wall, a second vertically extending side wall, a plurality of outlet orifices formed in the second side wall, a plurality of passages extending laterally through the exhaust manifold between the plurality of inlet orifices and the plurality of outlet orifices, each of the plurality of inlet orifices have a bore with an opening facing and horizontally aligned with a respective gap and a respective semiconductor wafer face adjacent to the respective gap to direct the flow of the process gas along the respective semiconductor wafer face from a respective showerhead mounted over the respective semiconductor wafer face, and the reaction gas is selectively drawn into the exhaust manifold through the plurality of inlet orifices and expelled out of the exhaust manifold through the plurality of outlet orifices.

17. The method of claim 16, wherein each of said passages extend from the first side to the second side at an angle with respect thereto, said angle being other than normal to the first and second sides.

18. The method of claim 17, wherein at least one angle of at least one passage is different from at least one other angle of at least one other passage.

19. The method of claim 16, wherein sizes of the plurality of inlet orifices vary along a vertical length of the exhaust manifold.

20. The method of claim 19, wherein the sizes of the plurality of inlet orifices progressively decrease from a first end of the exhaust manifold to a second end of the exhaust manifold.

* * * * *